United States Patent
Park et al.

(10) Patent No.: US 8,711,069 B2
(45) Date of Patent: Apr. 29, 2014

(54) CIRCUIT BOARD AND DISPLAY PANEL ASSEMBLY HAVING THE SAME

(75) Inventors: Ki-Yong Park, Seoul (KR); Young-Soo Choi, Seoul (KR); Hyeok-Tae Kwon, Daegu (KR)

(73) Assignee: Samsung Display Co., Ltd. (KR)

( * ) Notice: Subject to any disclaimer, the term of this patent is extended or adjusted under 35 U.S.C. 154(b) by 577 days.

(21) Appl. No.: 12/622,491

(22) Filed: Nov. 20, 2009

(65) Prior Publication Data

US 2010/0207855 A1 Aug. 19, 2010

(30) Foreign Application Priority Data

Feb. 16, 2009 (KR) .................. 10-2009-0012222

(51) Int. Cl.
G09G 3/36 (2006.01)

(52) U.S. Cl.
USPC ............... 345/87; 345/86; 345/102; 174/255; 174/260

(58) Field of Classification Search
None
See application file for complete search history.

(56) References Cited

U.S. PATENT DOCUMENTS

| | | | |
|---|---|---|---|
| 6,198,362 B1 * | 3/2001 | Harada et al. .................. 333/12 |
| 6,342,682 B1 * | 1/2002 | Mori et al. ..................... 174/262 |
| 6,388,200 B2 * | 5/2002 | Schaper ........................ 174/255 |
| 6,613,986 B1 * | 9/2003 | Hirose et al. .................. 174/255 |
| 6,682,953 B2 * | 1/2004 | Sakai et al. ................... 438/106 |
| 6,937,480 B2 * | 8/2005 | Iguchi et al. .................. 361/780 |
| 7,279,412 B2 * | 10/2007 | Mok et al. ..................... 438/622 |
| 7,428,155 B2 * | 9/2008 | Nakao ........................... 361/794 |
| 8,120,162 B2 * | 2/2012 | Shah ............................. 257/690 |
| 8,294,240 B2 * | 10/2012 | Nowak et al. ................. 257/532 |
| 8,395,881 B2 * | 3/2013 | Togashi ....................... 361/306.3 |
| 2004/0134681 A1 * | 7/2004 | Tsukahara et al. ............ 174/255 |
| 2005/0073818 A1 * | 4/2005 | Hirano et al. ................. 361/763 |
| 2005/0124196 A1 * | 6/2005 | Olson et al. ................... 439/260 |
| 2005/0263884 A1 * | 12/2005 | Sawada ......................... 257/737 |
| 2005/0276002 A1 * | 12/2005 | Sridharan et al. .......... 361/321.1 |
| 2006/0274250 A1 * | 12/2006 | Ono et al. ...................... 349/141 |
| 2007/0030659 A1 * | 2/2007 | Suzuki et al. ................. 361/793 |
| 2007/0144770 A1 * | 6/2007 | Nakao ........................... 174/260 |
| 2007/0146980 A1 * | 6/2007 | Ahn et al. ...................... 361/681 |
| 2007/0236910 A1 * | 10/2007 | Yun et al. ........................ 362/29 |
| 2007/0258225 A1 * | 11/2007 | Inagaki et al. ................. 361/763 |
| 2008/0024714 A1 * | 1/2008 | Park .............................. 349/150 |
| 2008/0169120 A1 * | 7/2008 | Inagaki et al. ................ 174/255 |
| 2009/0064493 A1 * | 3/2009 | Kariya et al. ................... 29/829 |

FOREIGN PATENT DOCUMENTS

| | | |
|---|---|---|
| JP | 10-303344 A | 11/1998 |
| KR | 1996-0001819 A | 1/1996 |
| KR | 1020070076064 A | 7/2007 |
| KR | 1020080081539 A | 9/2008 |

* cited by examiner

*Primary Examiner* — Dismery Mercedes
(74) *Attorney, Agent, or Firm* — Cantor Colburn LLP

(57) ABSTRACT

A circuit board includes a capacitor and a circuit substrate. The capacitor is mounted on the first insulation layer, and a first conductive layer is disposed between the first and second insulation layers. A plurality of first holes is disposed extended through the first conductive layer, and has a mesh pattern to decrease the spread of vibration generated by the capacitor. A third insulation layer is disposed in the first holes, and the third and first insulation layers may include the same material.

19 Claims, 10 Drawing Sheets

CIRCUIT BOARD AND DISPLAY PANEL ASSEMBLY HAVING THE SAME

This application claims priority to Korean Patent Application No. 2009-12222, filed on Feb. 16, 2009 and all the benefits accruing therefrom under 35 U.S.C. §119, the contents of which are herein incorporated by reference in their entirety.

BACKGROUND OF THE INVENTION

1. Field of the Invention

The present invention relates to a circuit board and a display panel assembly including the circuit board. More particularly, the present invention relates to a circuit board for improving the display quality of a display apparatus and a display panel assembly including the circuit board.

2. Description of the Related Art

Liquid crystal display ("LCD") apparatuses are widely used as flat panel display apparatuses, and are different from cathode ray tube ("CRT") or plasma display panel ("PDP") display apparatuses. The LCD apparatuses are passive display apparatuses which need a light source for displaying images. The light provided by a backlight source selectively passes through an LCD panel to display the images according to display signals.

A printed circuit board ("PCB") includes a driving element applying the display signals to the LCD panel. The driving element includes a timing controller, a converter, a capacitor, etc.

As LCD panels have increased in size, current consumption needs for the LCD panels have also increased, and thus driving elements have become overloaded. As a result, noise generated by PCBs has recently become a significant problem. For example, the capacitor may generate excessive vibration during operation to cause noise.

BRIEF SUMMARY OF THE INVENTION

The present invention provides a circuit board capable of decreasing noise due to vibration.

The present invention also provides a display panel assembly including the circuit board.

According to an exemplary embodiment of the present invention, a circuit board includes a capacitor and a circuit substrate. The circuit substrate includes a first insulation layer on which the capacitor is mounted, a second insulation layer facing the first insulation layer, a first conductive layer disposed between the first and second insulation layers, and a third insulation layer. A plurality of first holes is formed through the first conductive layer, and the first holes have a mesh pattern to decrease the spread of vibration generated by the capacitor. The third insulation layer is formed in the first holes.

In exemplary embodiment, a plurality of second holes may be formed through the first insulation layer corresponding to the first holes. The first and third insulation layers may include the same material.

According to an exemplary embodiment of the present invention, a display panel assembly includes a display panel, a printed circuit film and a circuit board. The printed circuit film is connected to a first side of the display panel. The circuit board includes a converter, a capacitor and a circuit substrate. The converter applies driving signals to the display panel through the printed circuit film. The capacitor may decrease noise of the driving signals. The circuit substrate is connected to the printed circuit film. The circuit substrate includes first, second and third insulation layers and a first conductive layer. The converter and the capacitor are mounted on the first insulation layer. The second insulation layer faces the first insulation layer, and the first conductive layer is disposed between the first and second insulation layers. A plurality of first holes is formed through the first conductive layer, and has a mesh pattern to decrease the spread of vibration generated by the capacitor. The third insulation layer is formed in the first holes.

In an exemplary embodiment, the display panel assembly may further include a gate driving part, a data driving part and a timing controller. The gate driving part is disposed on a second side of the display panel opposite to the first side of the display panel. The data driving part is mounted on the printed circuit film. The timing controller is mounted on the first insulation layer and controls the driving signals. A plurality of second holes may be formed through the first insulation layer corresponding to the first holes. The first and third insulation layers may include the same material.

According to exemplary embodiments of a circuit board and a display panel assembly including the circuit board, the holes formed as a mesh pattern may decrease the spread of vibration generated by the capacitor. Thus, the display quality of a display apparatus including the circuit board may be improved.

BRIEF DESCRIPTION OF THE DRAWINGS

The above and other features and advantages of the present disclosure of invention will become more apparent by describing in detailed exemplary embodiments thereof with reference to the accompanying drawings, in which.

DETAILED DESCRIPTION OF THE INVENTION

Figure 1:
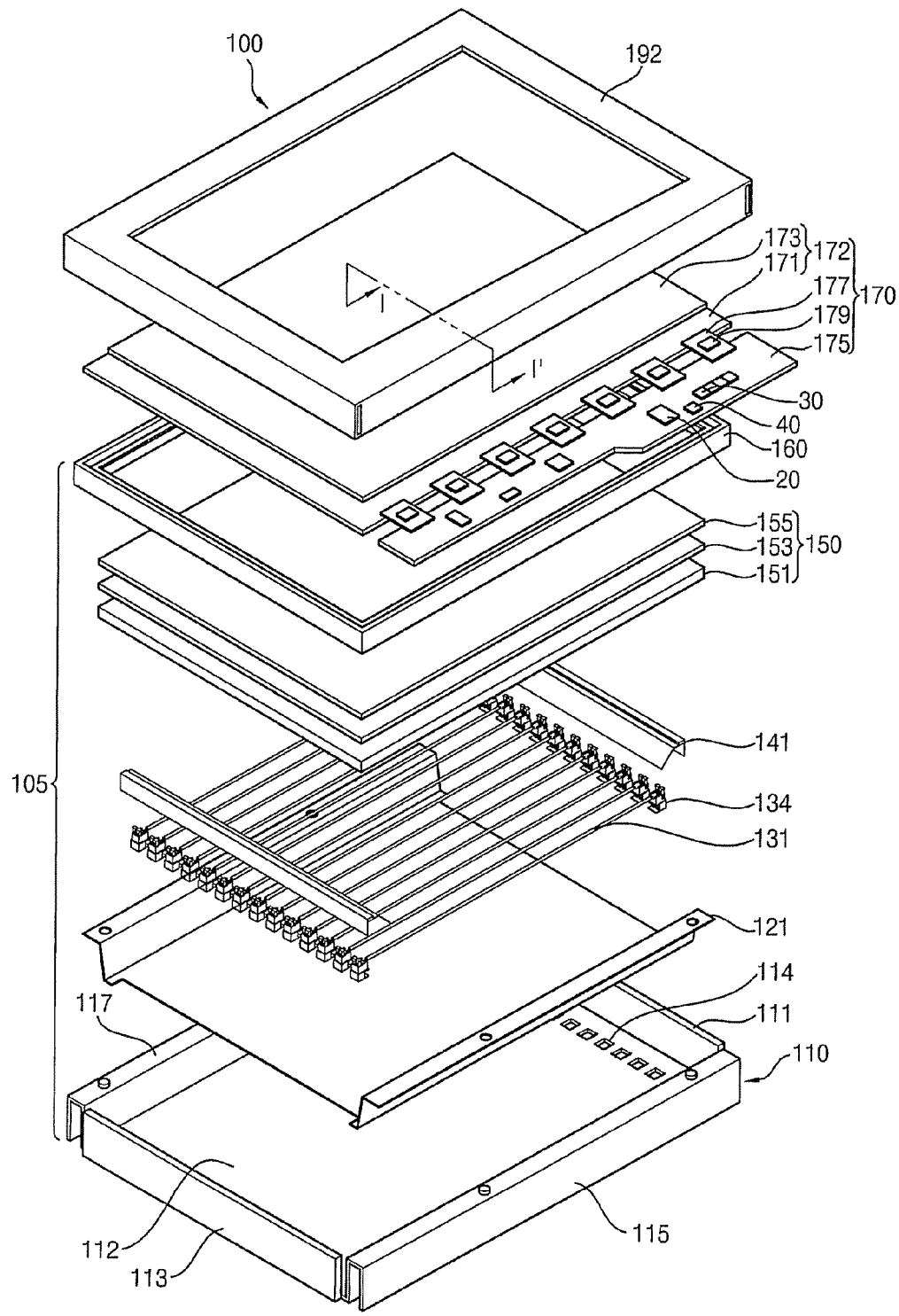
FIG. 1 is an exploded perspective view illustrating a display apparatus including a display panel assembly according to an exemplary embodiment of the present invention.

Although the present disclosure is described more fully hereinafter with reference to the accompanying drawings, the underlying concepts may, however, be embodied in many different forms and should not be construed as limited to the exemplary embodiments set forth herein. Rather, these exemplary embodiments are provided so that this disclosure will be thorough and complete, and will fully convey its teachings to those skilled in the pertinent art. In the drawings, the sizes and relative sizes of layers and regions may be exaggerated for sake of clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "lower" relative to other elements or features would then be oriented "upper" relative to the other elements or features. Thus, the exemplary term "lower" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the present invention.

Unless otherwise defined, all terms (including technical and scientific terms) used herein have the same meaning as commonly understood by one of ordinary skill in the pertinent art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure of invention will be explained in detail with reference to the accompanying drawings.

Figure 2:
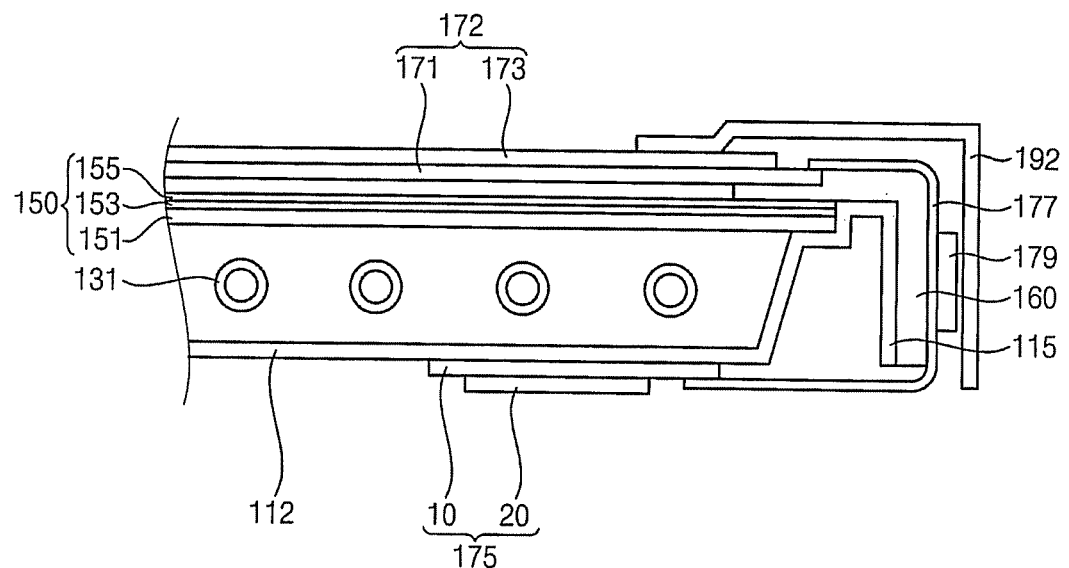
FIG. 2 is a schematically cross-sectional view taken along line I-I' in FIG. 1.

FIG. 1 is an exploded perspective view illustrating a display apparatus 100 including a display panel assembly 170 according to an exemplary embodiment of the present invention. FIG. 2 is a schematically cross-sectional view taken along line I-I' in FIG. 1.

Referring to FIGS. 1 and 2, the display apparatus 100 includes the display panel assembly 170 and a backlight assembly 105. The display panel assembly 170 according to the illustrated exemplary embodiment is disposed over and overlapping the backlight assembly 105 to display images using light provided from the backlight assembly 105. The display panel assembly 170 includes a display panel 172, a circuit board 175 and a printed circuit film 177.

The display panel 172 displays images on a display area thereof, based on the light provided from the backlight assembly 105, and gate signals and data signals generated by the circuit board 175 described below. Any type of flat panel display may be employed as the display panel 172 when the flat panel display is driven by the circuit board 175. In one exemplary embodiment, the display panel 172 may be a liquid crystal display ("LCD") panel. The display panel 172 includes a lower substrate 171, an upper substrate 173 facing the lower substrate 171, and a liquid crystal layer (not shown) interposed between the lower and upper substrates 171 and 173.

The arrangement of the liquid crystal layer is altered by an electric field which is generated between the lower and upper substrates 171 and 173.

In one exemplary embodiment, the lower substrate 171 may include a lower base substrate, a gate line, a data line, a switching element, a pixel electrode and a storage electrode. The gate signals are transmitted through the gate line which is disposed on the lower base substrate. The data signals are transmitted through the data line which is insulated from the gate line. The switching element is electrically connected to the gate and data lines. The switching element applies the data signals to the pixel electrode in accordance with the gate signals.

The upper substrate 173 includes red, green and blue color filters facing each pixel electrode, and a common electrode. The common electrode is disposed on the red, green and blue color filters. The common electrode forms the electric field applied to the liquid crystal layer, with the pixel electrode.

In the illustrated exemplary embodiment, the display panel 172 includes a gate driving part (not shown). The gate driving part applies the gate signals to the gate lines. The gate driving part is disposed in a peripheral area of a short side of the lower substrate 171, and is electrically connected to the gate lines. In one exemplary embodiment, the gate driving part may have a driving integrated circuit (IC) to be mounted on the lower substrate 171. Alternatively, the gate driving part may be directly disposed and/or integrated on the lower substrate 171. In addition, although not shown in FIGS. 1 and 2, the gate driving part having a driving IC may be mounted on a printed circuit film for gate driving part such as a tape carrier package ("TCP") or chip on film ("COF") to be electrically connected to the short side of the lower substrate 171.

The circuit board 175 applies the gate and data signals to the display panel 172 through the printed circuit film 177.

The display panel assembly 170 may further include a data driving part 179. The data driving part 179 is mounted on the printed circuit film 177 to apply the data signals to the data lines disposed on the lower substrate 171. The printed circuit film 177 is connected to a data pad disposed on a long side edge portion of the lower substrate 171, and is electrically connected to the data lines.

The backlight assembly 105 may further include a receiving container 110, a plurality of a lamp 131, a plurality of a lamp socket 134, a plurality of a side mold 141, a reflective plate 121, an optical sheet member 150 and a middle mold 160. The receiving container 110 includes a bottom plate 112, and sidewalls 111, 113, 115 and 117 extending from edges of the bottom plate 112, such as to form a unitary indivisible and continuous member of the receiving container 110.

The reflective plate 121 is disposed on and overlapping substantially an entire of the bottom plate 112 of the receiving container 110. The reflective plate 121 may be a unitary indivisible and continuous member. The lamps 131 are disposed in the receiving container 110, and are spaced apart from the bottom plate 112. The lamp socket 134 is connected to an end portion of the lamp 131, such as being disposed at each of two opposing ends of a single lamp 131. The lamp socket 134 may be exposed to a rear surface of the bottom plate 112 and to an external of the display apparatus 100, through a hole 114 which is disposed extended completely through the bottom plate 112. The hole 114 is considered a closed opening penetrating the bottom plate 112 of the receiving container 110, and the bottom plate 112 solely defines the enclosed hole 114. The lamp socket 134 may receive driving power from an inverter (not shown) disposed on the rear surface of the bottom plate 112. The bottom plate 112 of the receiving container 110 may define a lowermost element and lowermost surface of the display apparatus 100.

The side mold 141 covers (e.g., overlaps) and protects the lamp sockets 134. The side mold 141 may be disposed at each of the two opposing ends of the plurality of lamps 131. The side mold 141 may be a unitary indivisible and continuous member, such that one of the side mold 141 overlaps all of the lamp sockets 134 at a same end of the plurality of lamps 131.

The optical sheet member 150 may include, but is not limited to, a diffusion plate 151, a diffusion sheet 153 and a condensing sheet 155. The optical sheet member 150 may be supported by the side mold 141, such that the optical sheet member 150 is disposed contacting an upper surface of the side mold 141. The middle mold 160 covers (e.g., overlaps) a side of the optical sheet member 150, to be combined with the receiving container 110. The side of the optical sheet member 150 may include side faces of each of the diffusion plate 151, the diffusion sheet 153 and the condensing sheet 155 illustrated in FIG. 1. The display panel 172 is disposed on stepped portions disposed on the middle mold 160.

The unitary indivisible and continuous printed circuit film 177 is disposed bent along the side wall 115 of the receiving container 110 as illustrated in FIG. 2, and the circuit board 175 is disposed on the rear surface of the bottom plate 112 of the receiving container 110.

The display apparatus 100 further includes a top chassis 192 which is combined with the receiving container 110, and which exposes the display area of the display panel 172 through a window disposed in a central portion of the top chassis 192 as illustrated in FIGS. 1 and 2.

Figure 3:
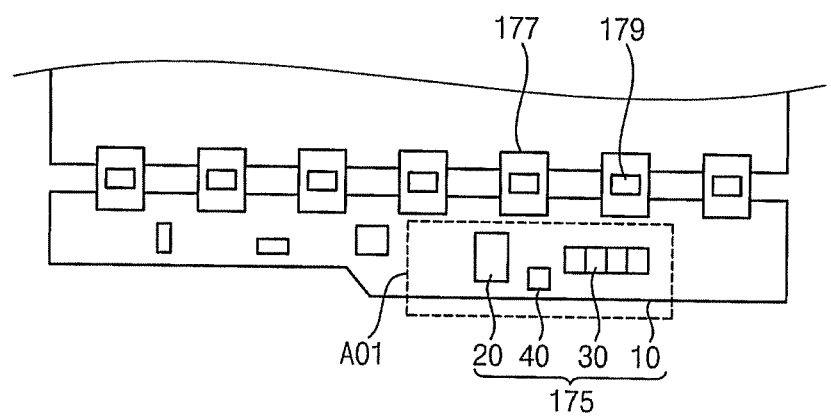
FIG. 3 is a plan view illustrating a portion of the display panel assembly in FIG. 1.
Figure 4:
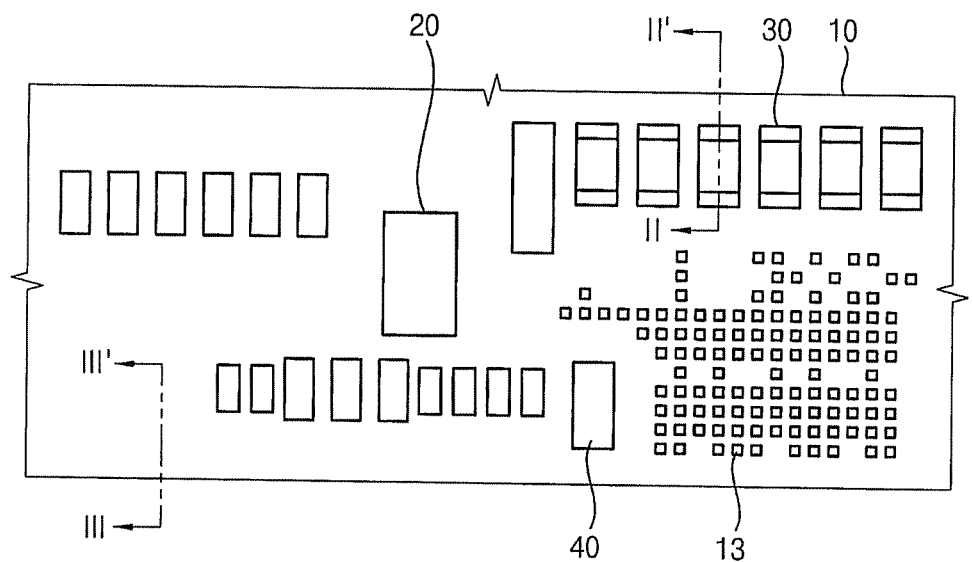
FIG. 4 is an enlarged plan view illustrating a portion of the circuit board in FIG. 3.

FIG. 3 is a plan view illustrating a portion of the display panel assembly 170 in FIG. 1. FIG. 4 is an enlarged plan view illustrating portion A01 of the circuit board 175 indicated in FIG. 3 by the dotted line box.

Referring to FIGS. 3 and 4, the circuit board 175 includes a timing controller 20, a direct current-to-direct current ("DC-DC") converter 40, a capacitor 30 and a circuit substrate 10. The circuit substrate 10 has a substantially flat (e.g., planar) shape.

The timing controller 20 outputs a control signal which controls the timing for applying the gate signals and the data signals.

The DC-DC converter 40 converts externally provided DC power into driving power, which is applied to the data driving part 179 and/or the gate driving part. The data driving part 179 and/or the gate driving part may use the driving power according to the control signals to generate and output the data signals and/or the gate signals.

Figure 5:
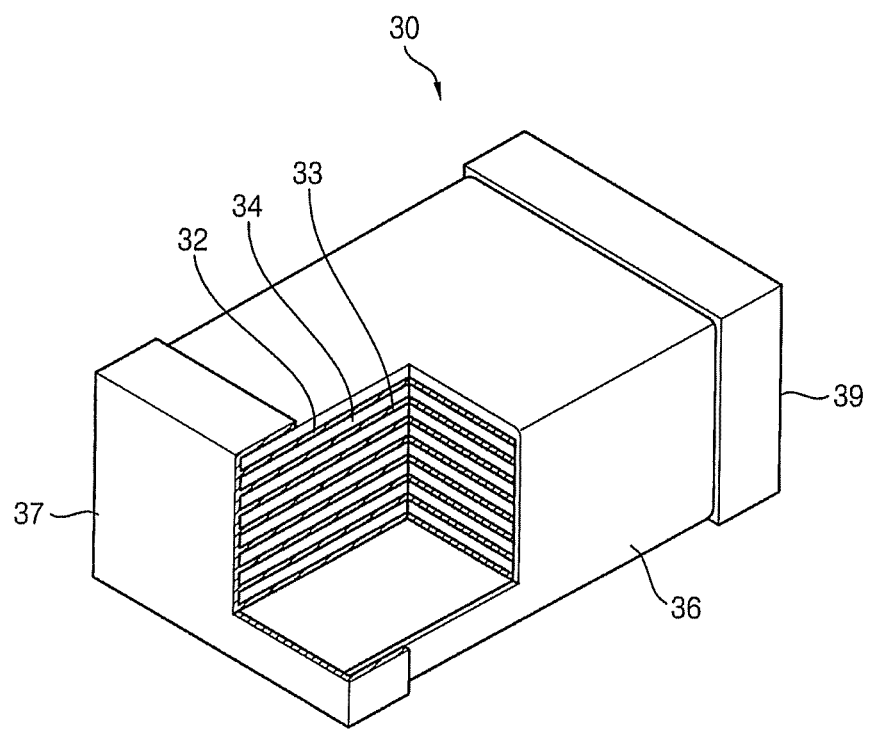
FIG. 5 is a perspective view illustrating an exemplary embodiment of a capacitor in FIG. 4.
Figure 6:
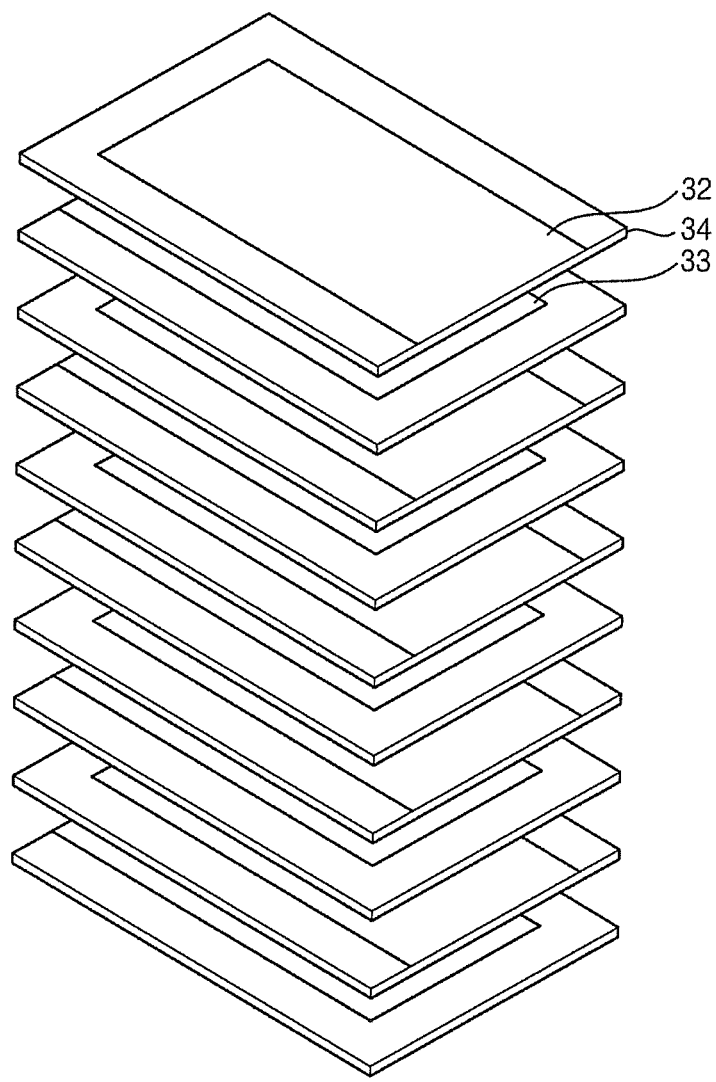
FIG. 6 is an exploded perspective view illustrating the capacitor in FIG. 5.

FIG. 5 is a perspective view illustrating an exemplary embodiment of the capacitor 30 in FIG. 4. FIG. 6 is an exploded perspective view illustrating the capacitor 30 in FIG. 5.

Referring to FIGS. 5 and 6, the capacitor 30 may increase the stability of the driving power and may decrease noise components included in the driving power. The capacitor 30 may be connected electrically and in parallel between the DC-DC converter 40 and the printed circuit film 177. The printed circuit film 177 is electrically connected to the data driving part 179 and/or the gate driving part.

In the illustrated embodiment, the capacitor 30 may be a parallel plate capacitor. Referring to FIGS. 5 and 6, the capacitor 30 may include a housing 36, a plurality of a ceramic plate 34, a plurality of electrode plates 32 and 33, a first power terminal 37 and a second power terminal 39. The ceramic plates 34 and the electrode plates 32 and 33 have a substantially flat (e.g., planar) shape.

The housing 36 may make contact with the circuit substrate 10 of the circuit board 175. Alternatively, the housing 36 may be spaced apart from the circuit substrate 10 by no less than about 1 millimeter (mm). The housing 36 receives the plurality of ceramic plates 34, and the plurality of electrode plates 32 and 33. The ceramic plates 34 and the electrode plates 32 and 33 are disposed in parallel with the circuit substrate 10 and/or the circuit board 175. The ceramic plates 34 are stacked on each other, and the electrode plates 32 and 33 are respectively interposed between the ceramic plates 34. An electrode plate 32 and 33 is disposed on each opposing side of the ceramic plate 34.

In the exemplary embodiment, the first power terminal 37 may be combined with a first side of the housing 36, and may be integrally connected to sides of odd-numbered electrode plates 32. The second power terminal 39 may be combined with a second side of the housing 36, and may be integrally connected to sides of even-numbered electrode plates 33. The sides of the even-numbered electrode plates 33 face the sides of the odd-numbered electrode plates 32. The first and second power terminals 37 and 39 may be respectively physically and electrically connected to first and second power pads 41 and 43 (shown in FIG. 10), such as by soldering. As used herein, "integrally" indicates a unitary indivisible and continuous member or element.

The capacitors 30 may be connected electrically and in parallel to connecting lines which connect the DC-DC converter 40 with the printed circuit film 177. In one exemplary, the first power pad 41 connected to the capacitors 30 may be connected to the connecting line, and the second power pad 43 may be grounded.

Figure 7A:
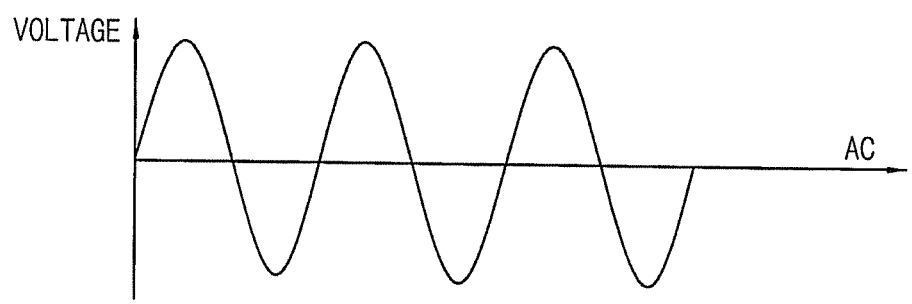
FIGS. 7A and 7B are waveform diagrams showing exemplary embodiments of power signals for explaining the operation of the direct current-to-direct current (DC-DC) converter of FIG. 4.
Figure 7B:
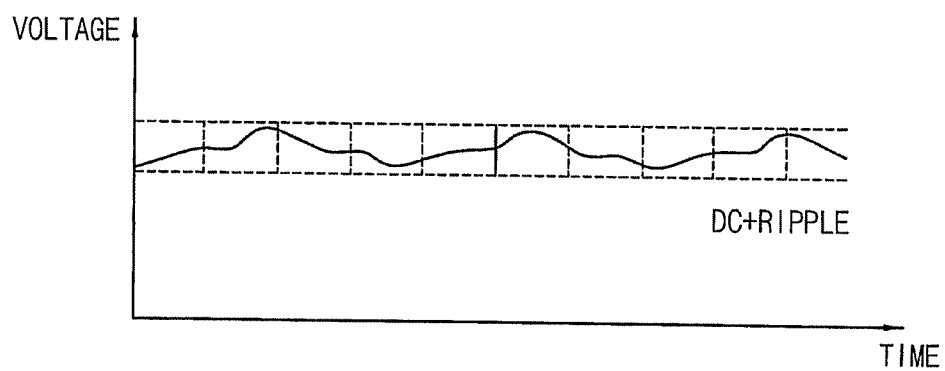

FIGS. 7A and 7B are waveform diagrams showing exemplary embodiment of power signals for explaining the operation of the DC-DC converter 40 of FIG. 4.

In FIGS. 7A and 7B, the horizontal axis represents time, and the vertical axis represents voltage. FIG. 7A shows a waveform of alternating current ("AC") power externally provided. The AC power may be converted into DC power by an external converter (not shown), and the DC power may be applied to the DC-DC converter 40. The DC-DC converter 40 outputs the driving power applied to the data and gate driving parts as described above.

FIG. 7B shows a waveform of a voltage applied to the capacitor 30. Noise components may be mixed in the voltage applied to the capacitor 30. As a result, the voltage having irregular waveforms such as ripples, as shown in FIG. 7B, may be applied to the capacitor 30.

Figure 8A:
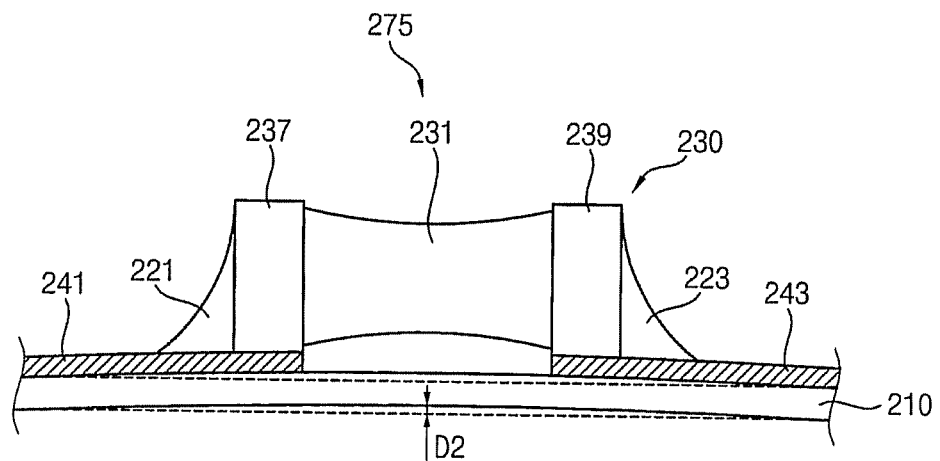
FIGS. 8A and 8B are cross-sectional views illustrating a conventional capacitor which vibrates to generate noise.
Figure 8B:
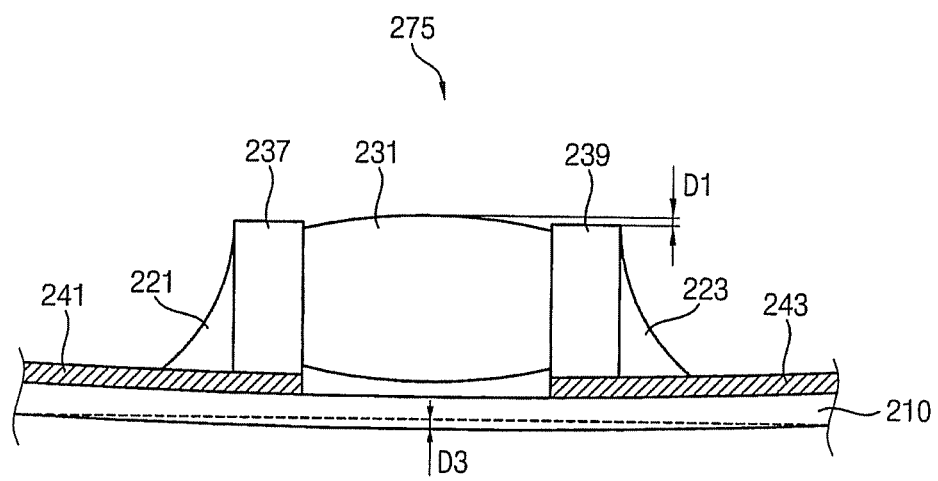

FIGS. 8A and 8B are cross-sectional views illustrating a conventional capacitor 230 which vibrates to generate noise. In FIGS. 8A and 8B, a circuit substrate, a first power pad, a second power pad, a first conductive member, and a second conductive member are represented by reference numerals "210", "241", "243", "237" and "239", respectively. In addition, a first soldering member, a second soldering member and a dielectric substance are represented by reference numerals "221," "223" and "231," respectively.

Referring to FIGS. 8A and 8B, when the driving power applied to the conventional capacitor 230 varies, a distance between the ceramic plate and the electrode plate irregularly varies in accordance with time. As a result, the conventional capacitor 230 repeatedly contracts and expands with an amplitude D1 in a normal direction of the ceramic plate and the electrode plate, which is perpendicular to the printed circuit board ("PCB") 275 as illustrated in FIGS. 8A and 8B.

A substrate as shown in FIGS. 8A and 8B is a conventional PCB 275, different from the circuit substrate 10 according to the illustrated exemplary embodiment. When the conventional capacitor 230 contracts, as shown in FIG. 8A, the conventional PCB 275 may be deformed to be upwardly bent by about a height D2 with respect to an initial state thereof shown as a dotted line. In addition, when the conventional capacitor 230 is expanded, as shown in FIG. 8B, the conventional PCB 275 may be deformed to be downwardly bent by about a height D3 with respect to an initial state thereof shown as a dotted line.

The conventional PCB 275 vibrates along the conventional capacitor 230. Vibration energy of the conventional PCB 275 may be easily spread along conductive layers disposed in the conventional PCB 275 to all of the conventional PCB 275. The vibration of the conventional PCB 275 and the conventional capacitor 230 may cause the contraction and expansion of air adjacent to the conventional PCB 275, so that noise is undesirably generated by the vibration. The noise may irritate a user of the display apparatus 100. In addition, excess noise may cause damage to the connection between the conventional capacitor 230 and the conventional PCB 275.

Figure 9:
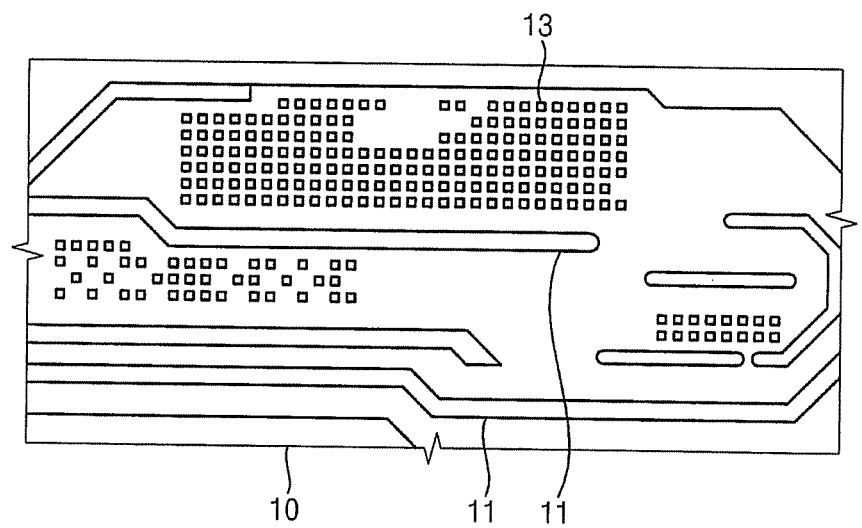
FIG. 9 is a plan view illustrating an exemplary embodiment of a rear surface of the circuit board in FIG. 4.
Figure 10:
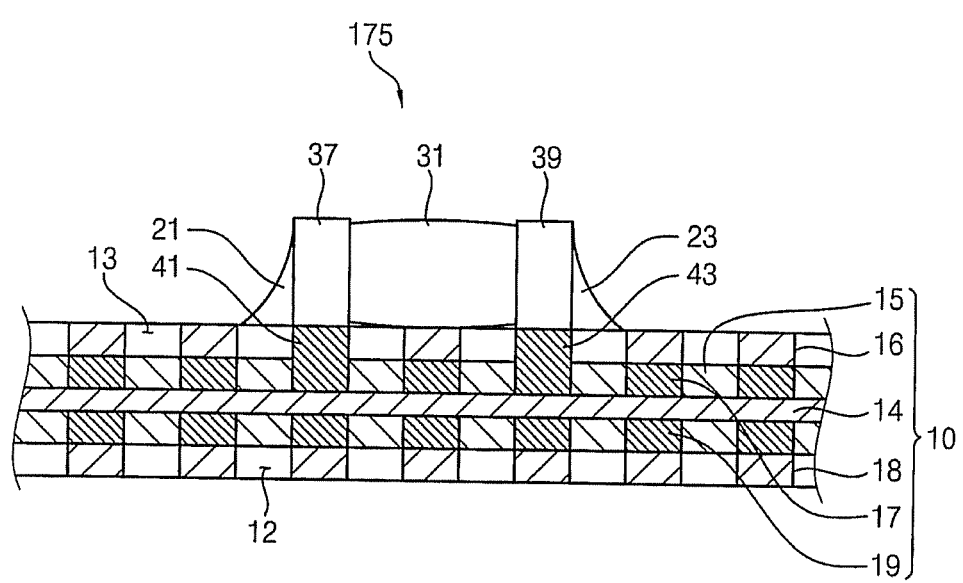
FIG. 10 is a cross-sectional view taken along line II-II' in FIG. 4.
Figure 11:
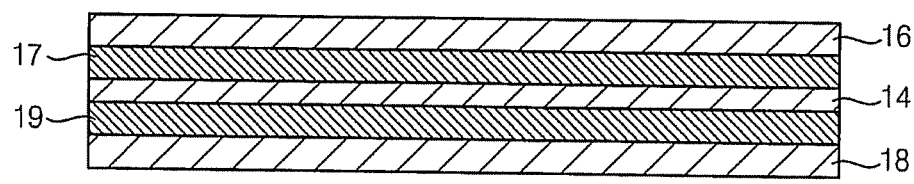
FIG. 11 is a cross-sectional view taken along line III-III' in FIG. 4.
Figure 12:
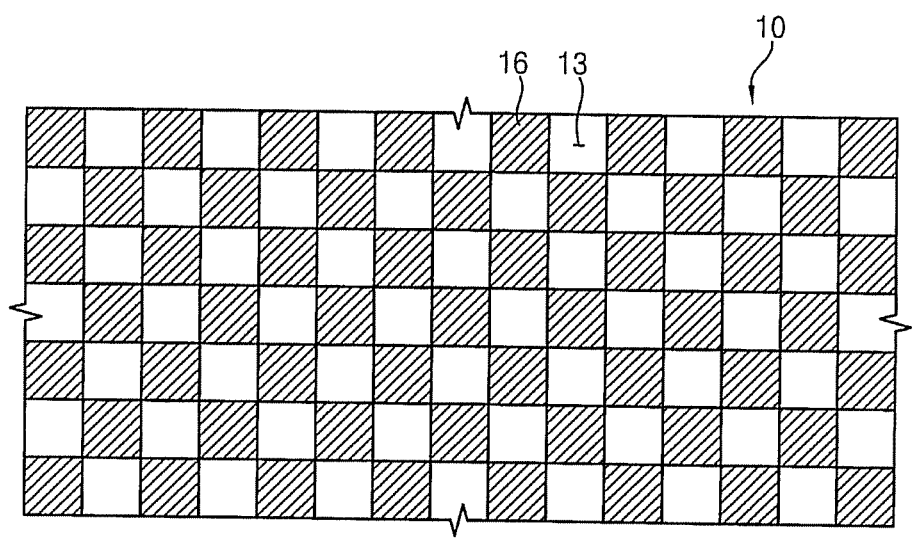
FIG. 12 is a plan view illustrating an exemplary embodiment of a hole disposed extended through a first insulation layer of the circuit board in FIG. 4.

FIG. 9 is a plan view illustrating an exemplary embodiment of a rear surface of the circuit board 175 in FIG. 4. FIG. 10 is a cross-sectional view taken along line II-IF in FIG. 4. FIG. 11 is a cross-sectional view taken along line III-III' in FIG. 4. FIG. 12 is a plan view illustrating an exemplary embodiment of a hole disposed extended through a first insulation layer of the circuit board 175 in FIG. 4.

Referring to FIGS. 4, 9, 10, 11 and 12, the circuit substrate 10 according to the exemplary embodiment includes first, second and third insulation layers 16, 14 and 15 and a first conductive layer 17. In FIG. 10, a capacitor 30 including a first conductive member 37, a dielectric substance 31 and a second conductive member 39, is disposed on the circuit substrate 10 according to the exemplary embodiment, such as through a first soldering member 21 and a second soldering member 23.

The timing controller 20, the DC-DC converter 40 and the capacitor 30 are mounted directly on the first insulation layer 16. The first conductive layer 17 is disposed directly between and contacting both the first and second insulation layers 16 and 14. The first conductive layer 17 is partially patterned to form circuit lines 11 as illustrated in FIG. 9.

In an exemplary embodiment of forming a circuit board 175, a plurality of first holes is formed extended completely through the first conductive layer 17, in substantially a mesh pattern or arrangement in a plan view of the circuit board 175. The first holes are formed in an area in which the circuit lines 11 are not formed, and are concentrated around and under the capacitor 30 as illustrated in FIGS. 4 and 10. The first holes are each considered a closed opening penetrating the first conductive layer 17, and the first conductive layer 17 solely defines the enclosed first holes.

The third insulation layer 15 is formed in the first holes. The first and third insulation layers 16 and 15 may include the same material, so that the first insulation layer 16 may extend into the first hole to form the third insulation layer 15.

A plurality of a second hole 13 is formed extending completely through the first insulation layer 16 corresponding to (e.g., aligned with) the first holes originally formed in the first conductive layer 17 and filled with the third insulation layer 15, as illustrated in FIGS. 10 and 12. In a plan and/or a cross sectional view, the first hole (where the third insulation layer 15 is disposed) and second hole 13 may have various shapes such as a triangular shape, a rectangular shape, etc. The second holes 13 are each considered a closed opening penetrating the first insulation layer 16, and the first insulation layer 16 solely defines the enclosed second holes 13.

The first hole and second hole 13 have the mesh pattern in the plan view of the circuit board 175, so that the vibration of the capacitor 30 may be decreased. The first holes originally formed in the first conductive layer 17 and filled with the third insulation layer 15, are aligned with and overlap the second holes 13, in the plan view and as illustrated in FIG. 10. Thus, the spread of the vibration of the capacitor 30 may be decreased, so that the noise may be decreased.

The circuit substrate 10 further includes a second conductive layer 19 and a fourth insulation layer 18. The second conductive layer 19 faces the first conductive layer 17, such as being considered aligned with the second conductive layer 17. The second insulation layer 14 is disposed between the first and second conductive layers 17 and 19. The second insulation layer 14 may be disposed directly on a whole of both the first and second conductive layers 17 and 19. The fourth insulation layer 18 faces the second insulation layer 14, and the second conductive layer 19 is disposed directly between the second and fourth insulation layers 14 and 18.

Third holes are formed extended completely through the second conductive layer 19 corresponding to the first holes, and the fourth insulation layer 18 extends into the third holes. The third holes are each considered a closed opening penetrating the second conductive layer 19, and the second conductive layer 19 solely defines the enclosed third holes. A plurality of a fourth hole 12 is formed extended completely through the fourth insulation layer 18 corresponding to (e.g., aligned with) the third holes originally formed in the second conductive layer 19 and filled with the fourth insulation layer 18. The fourth holes 12 are each considered a closed opening penetrating the fourth insulation layer 18, and the fourth insulation layer 18 solely defines the enclosed fourth holes 12.

Figure 13:
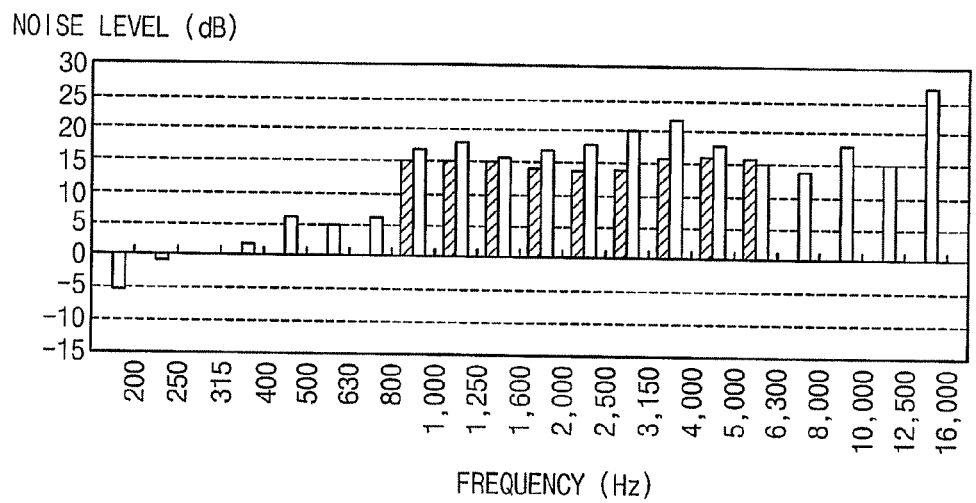
FIG. 13 is a graph of noise measured from a conventional printed circuit board ("PCB") in FIGS. 8A and 8B.
Figure 14:
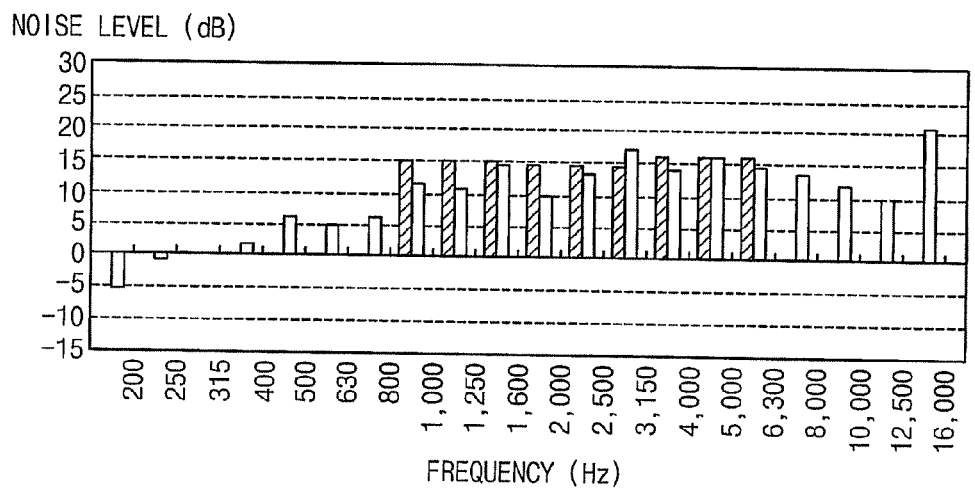
FIG. 14 is a graph of an exemplary embodiment of noise measured from the circuit board in FIG. 10.

FIG. 13 is a graph of noise measured from the conventional PCB 275 in FIGS. 8A and 8B. FIG. 14 is a graph of an exemplary embodiment of noise measured from the circuit board 175 in FIG. 10.

The horizontal axis in FIGS. 13 and 14 indicates the frequency of the driving power applied to the capacitors 230 and 30 in FIGS. 8A and 10, respectively, and the vertical axis in FIGS. 13 and 14 indicates the level of the noise generated by the conventional PCB 275 in FIG. 8A and the circuit board 175 according to the an exemplary embodiment in FIG. 10.

Referring to FIGS. 13 and 14, when the driving power has a frequency from about 800 Hertz (Hz) to 1,600 Hz, the noise generated by the conventional PCB 275 is measured to have a level higher than 15 dB in many cases. However, the noise generated by the circuit board 175 is measured to have a level lower than 15 dB in most cases, so that the noise may be decreased from the conventional PCB 275. According to results of tests for many circuit board 175 samples, the noise from the circuit board 175 have a level lower by about 5.65 dB, than that of the noise from the conventional PCB 275, and thus the noise may be decreased by about 17% in comparison to the conventional PCB 275. Thus, according to the illustrated exemplary embodiment, noise from the display apparatus 100 may be decreased, so that the display quality of the display apparatus 100 may be increased.

Figure 15:
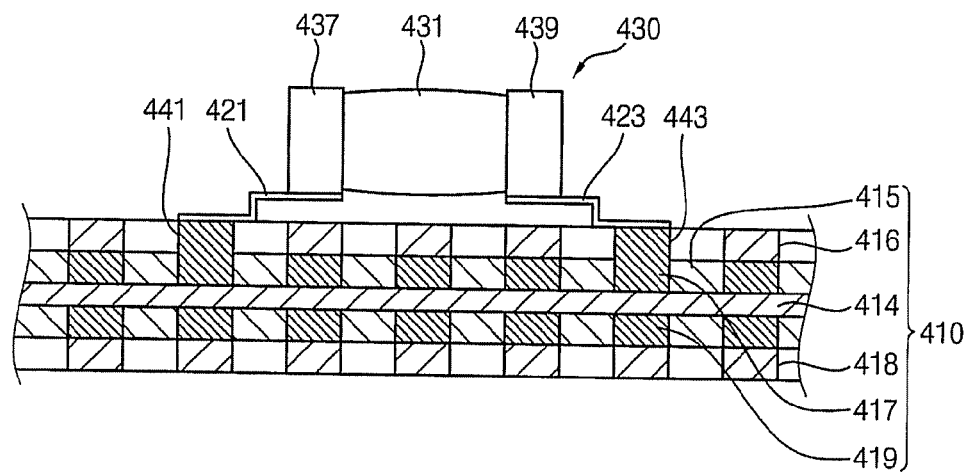
FIG. 15 is a cross-sectional view illustrating a circuit board according to another exemplary embodiment of the present invention.

FIG. 15 is a cross-sectional view illustrating a circuit board 575 according to another exemplary embodiment of the present invention.

Referring to FIG. 15, a circuit board 575 and a display panel assembly according to an exemplary embodiment is substantially the same as the circuit board 175 and the display panel assembly 170 according to the exemplary embodiment 1 illustrated in FIGS. 1 to 14, except that a capacitor 430 further includes lead lines 421 and 423 which connect the capacitor 430 with a circuit substrate 410. Thus, further descriptions concerning the circuit board 575 and the display panel assembly according to the illustrated exemplary embodiment will be omitted.

The circuit substrate 410 according to the exemplary embodiment includes first, second and third insulation layers 416, 414 and 415 and a first conductive layer 417. The circuit substrate 410 further includes a second conductive layer 419 and a fourth insulation layer 418. The capacitor 430, including a first conductive member (e.g., power terminal) 437, a dielectric substance 431 and a second conductive member (e.g., power terminal) 439, is disposed on the circuit substrate 410.

In the illustrated exemplary embodiment, a first lead line 421 of the capacitor 430 connects the first power terminal 437 of the capacitor 430 with a first power pad 441 disposed on the circuit substrate 410. A second lead line 423 of the capacitor 430 connects the second power terminal 439 of the capacitor 430 with a second power pad 443 disposed on the circuit substrate 410. The first and second lead lines 421 and 423 make the capacitor 430 spaced apart from the circuit substrate 410 by no less than about 5 mm. Each of the first and second lead lines 421 and 423 is a unitary indivisible and continuous member which extends from the capacitor 430 to the circuit substrate 410. Vibration of the capacitor 430 may hardly be spread to the circuit substrate 410 through the first and second lead lines 421 and 423, so that vibration distribution through the first and second lead lines 421 and 423 may be negligible. Therefore, according to the illustrated exemplary embodiment, noise generated by the capacitor 430 may be remarkably decreased.

Figure 16:
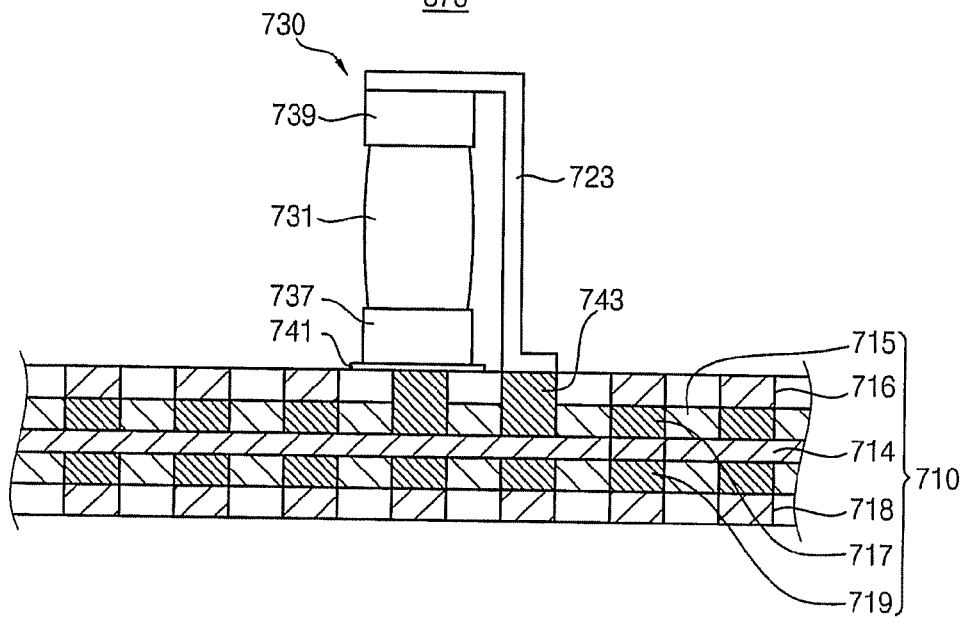
FIG. 16 is a cross-sectional view illustrating a circuit board according to another exemplary embodiment of the present invention.

FIG. 16 is a cross-sectional view illustrating a circuit board 875 according to another exemplary embodiment of the present invention.

Referring to FIG. 16, a circuit board 875 and a display panel assembly according to the illustrated exemplary embodiment is substantially the same as the circuit board 175 and the display panel assembly 170 according to the exemplary embodiment illustrated in FIGS. 1 to 14, except that a capacitor 730 further includes a lead line 723 which connects the capacitor 730 with a circuit substrate 710, and is longitudinally disposed perpendicular to the circuit substrate 710. Thus, further descriptions concerning the circuit board 875 and the display panel assembly according to the illustrated exemplary embodiment will be omitted.

The circuit substrate 710 according to the exemplary embodiment includes first, second and third insulation layers 716, 714 and 715 and a first conductive layer 717. The circuit substrate 710 further includes a second conductive layer 719 and a fourth insulation layer 718. The capacitor 730, including a first conductive member (e.g., power terminal) 737, a dielectric substance 731 and a second conductive member (e.g., power terminal) 739, is disposed on the circuit substrate 710.

In the illustrated exemplary embodiment, ceramic plates and electrode plates of the capacitor 730 are disposed perpendicular to the circuit substrate 710. Thus, the first power terminal 737 makes direct contact with a first power pad 741 disposed on the circuit substrate 710, and may be connected to the first power pad 741 by soldering. The first power pad 741, the first power terminal 737, the dielectric substance 731 and the second power terminal 739 are substantially aligned with and overlap each other in the plan view of the circuit substrate 710. The lead line 723 of the capacitor 730 connects the second power terminal 739 of the capacitor 730 with a second power pad 743 disposed on the circuit substrate 710. The lead line 723 is a unitary indivisible and continuous member which extends from a distal end of the capacitor 730 to the circuit substrate 710.

The capacitor 730 causes vibration along a direction parallel with the circuit substrate 710, and vibration along the normal direction may be remarkably decreased because the capacitor 730 is disposed perpendicular to the circuit substrate 710. Therefore, according to the illustrated exemplary embodiment, noise generated by the capacitor 730 may be remarkably decreased.

According to a circuit board and a display panel assembly including the circuit board in accordance with exemplary embodiments of the present invention, noise due to vibration generated by a driving element, such as a capacitor, may be remarkably decreased. Thus, the present invention may be applied to an apparatus, such as a display apparatus, using a capacitor.

The foregoing is illustrative and is not to be construed as limiting of the teachings provided herein. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present teachings. In the below claims, means-plus-function clauses are intended to cover the structures described herein as performing the recited function and not only structural equivalents but also functionally equivalent structures. Therefore, it is to be understood that the foregoing is illustrative and is not to be construed as limited to the specific exemplary embodiments disclosed, and that modifications to the disclosed exemplary embodiments, as well as other exemplary embodiments, are intended to be included within the scope of the teachings.

What is claimed is:

1. A circuit board comprising:
   a capacitor; and
   a circuit substrate including:
      a first insulation layer on which the capacitor is mounted;
      first holes defined in and extended completely through the first insulation layer;
      a second insulation layer facing the first insulation layer;
      a first conductive layer disposed between the first and second insulation layers;
      a plurality of second holes defined in and extended completely through the first conductive layer, wherein the second holes are arranged in a mesh pattern in a plan view of the circuit substrate, aligned with the first holes in the first insulation layer, and decrease a spread of vibration generated by the capacitor; and
      a third insulation layer disposed in the second holes and exposed to the capacitor via the first holes in the first insulation layer.

2. The circuit board of claim 1, wherein the first and third insulation layers include a same material.

3. The circuit board of claim 1, wherein the first conductive layer is partially patterned to include circuit lines, and the second holes in the first conductive layer are disposed in an area in which the circuit lines are not disposed on the circuit substrate.

4. The circuit board of claim 1, wherein the circuit substrate further includes:
   a second conductive layer facing the first conductive layer, the second insulation layer being disposed between the first and second conductive layers; and
   a fourth insulation layer facing the second insulation layer, the second conductive layer being disposed between the second and fourth insulation layers.

5. The circuit board of claim 4, further comprising:
   a plurality of third holes defined in and extended completely through the second conductive layer and aligned with the second holes, the fourth insulation layer extends into the third holes, and
   a plurality of fourth holes defined in and extended completely through the fourth insulation layer and aligned with the third holes.

6. The circuit board of claim 1, wherein the capacitor comprises:
   a plurality of ceramic plates stacked on each other;
   a plurality of electrode plates respectively disposed between the ceramic plates;
   a first power terminal connected to sides of odd-numbered electrode plates; and
   a second power terminal connected to sides of even-numbered electrode plates, the sides of the even-numbered electrode plates facing the sides of the odd-numbered electrode plates.

7. The circuit board of claim 6, wherein the ceramic plates and the electrode plates are disposed substantially parallel with the circuit substrate.

8. The circuit board of claim 7, wherein the first and second power terminals of the capacitor are respectively connected to first and second power pads disposed on the circuit substrates.

9. The circuit board of claim 7, wherein the capacitor further comprises first and second lead lines each of which respectively connect the first and second power terminals of the capacitor with first and second power pads disposed on the circuit substrates, so that the capacitor is spaced apart from the circuit substrate.

10. The circuit board of claim 6, wherein the ceramic plates and the electrode plates are longitudinally disposed substantially perpendicular to the circuit substrate, the first power terminal adjacent to the circuit substrate is connected to a first power pad disposed on the circuit substrate, and the capacitor further comprises a unitary indivisible lead line which connects the second power terminal with a second power pad disposed on the circuit substrate.

11. The circuit board of claim 1, further comprising a timing controller mounted on the first insulation layer and controlling driving signals for a display panel, wherein the capacitor decreases noise from driving power applied to a display panel driving integrated circuit.

12. A display panel assembly comprising:
   a display panel;
   a printed circuit film connected to a first side of the display panel; and
   a circuit board including:
      a converter applying driving signals to the display panel through the printed circuit film;
      a capacitor decreasing noise of the driving signals; and
      a circuit substrate connected to the printed circuit film and including:
         a first conductive layer;
         a plurality of first holes defined in and extended completely through the first conductive layer, wherein the first holes are arranged in a mesh pattern and decrease a spread of vibration generated by the capacitor;
         first, second and third insulation layers; and
         a plurality of second holes defined in and extended completely through the first insulation layer, the second holes aligned with the first holes of the first conductive layer;
      wherein
         the converter and the capacitor are mounted on the first insulation layer,
         the second insulation layer faces the first insulation layer,
         the first conductive layer is disposed between the first and second insulation layers, and
         the third insulation layer is disposed in the first holes and exposed to the capacitor via the second holes in the first insulation layer.

13. The display panel assembly of claim 12, further comprising:
   a gate driving part disposed at a second side of the display panel opposite to the first side of the display panel;
   a data driving part mounted on the printed circuit film; and
   a timing controller mounted on the first insulation layer and controlling the driving signals.

14. The display panel assembly of claim 13, wherein the first and third insulation layers include a same material.

15. The display panel assembly of claim 13, wherein the circuit substrate further includes:

a second conductive layer facing the first conductive layer, the second insulation layer being disposed between the first and second conductive layers, a plurality of third holes defined in and extending completely through the second conductive layer and aligned with the first holes; and a fourth insulation layer facing the second insulation layer, the second conductive layer being disposed between the second and fourth insulation layers, a plurality of fourth holes defined in and extending completely through the fourth insulation layer and aligned with the third holes, and the fourth insulation layer extending into the third holes.

16. The display panel assembly of claim 13, wherein the capacitor comprises:

a plurality of ceramic plates stacking on each other;

a plurality of electrode plates respectively disposed between the ceramic plates;

a first power terminal connected to sides of odd-numbered electrode plates; and a second power terminal connected to sides of even-numbered electrode plates, the sides of the even-numbered electrode plates facing the sides of the odd-numbered electrode plates.

17. The display panel assembly of claim 16, wherein the ceramic plates and the electrode plates are disposed substantially parallel with the circuit substrate.

18. The display panel assembly of claim 16, wherein the capacitor further comprises first and second lead lines each of which respectively connect the first and second power terminals of the capacitor with first and second power pads disposed on the circuit substrates, so that the capacitor is spaced apart from the circuit substrate.

19. The display panel assembly of claim 16, wherein the ceramic plates and the electrode plates are longitudinally disposed substantially perpendicular to the circuit substrate, the first power terminal of the capacitor adjacent to the circuit substrate is connected to a first power pad disposed on the circuit substrate, and the capacitor further comprises a unitary indivisible lead line which connects the second power terminal of the capacitor with a second power pad disposed on the circuit substrate.

\* \* \* \* \*